US011075186B2

(12) United States Patent
Hu et al.

(10) Patent No.: US 11,075,186 B2
(45) Date of Patent: Jul. 27, 2021

(54) SEMICONDUCTOR PACKAGE

(71) Applicant: Advanced Semiconductor Engineering, Inc., Kaohsiung (TW)

(72) Inventors: Ian Hu, Kaohsiung (TW); Jia-Rung Ho, Kaohsiung (TW); Jin-Feng Yang, Kaohsiung (TW); Chih-Pin Hung, Kaohsiung (TW); Ping-Feng Yang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/429,024

(22) Filed: Feb. 9, 2017

(65) Prior Publication Data

US 2018/0226320 A1    Aug. 9, 2018

(51) Int. Cl.
*H01L 23/00* (2006.01)
*H01L 23/367* (2006.01)
(Continued)

(52) U.S. Cl.
CPC .............. *H01L 24/48* (2013.01); *H01L 23/04* (2013.01); *H01L 23/3135* (2013.01); *H01L 23/3142* (2013.01); *H01L 23/367* (2013.01); *H01L 23/373* (2013.01); *H01L 23/3121* (2013.01); *H01L 24/13* (2013.01); *H01L 24/16* (2013.01);
(Continued)

(58) Field of Classification Search
CPC ............. H01L 23/3735; H01L 23/3121; H01L 23/3142; H01L 23/3135; H01L 23/04; H01L 24/48; H01L 23/367; H01L 23/3128; H01L 23/49822; H01L 23/552; H01L 21/563; H01L 24/32; H01L 2924/0002

USPC ........ 257/704, 707, 713, E21.503, E23.062, 257/E23.114; 361/704, 719, 718; 438/122

See application file for complete search history.

(56) References Cited

U.S. PATENT DOCUMENTS 5,371,404 A * 12/1994 Juskey ................ H01L 23/3675
257/659
6,713,878 B2 * 3/2004 Goetschalckx ..... H01L 23/3135
257/778
(Continued)

FOREIGN PATENT DOCUMENTS

| CN | 102569208 A | 7/2012 |
| CN | 102683302 A | 9/2012 |
| CN | 205789928 U | 12/2016 |

OTHER PUBLICATIONS

Office Action in corresponding Chinese Patent Application No. 201710692396.4, dated Nov. 3, 2020, 11 pages.
(Continued)

*Primary Examiner* — Mouloucoulaye Inoussa
(74) *Attorney, Agent, or Firm* — Foley & Lardner LLP

(57) ABSTRACT

A semiconductor package includes a substrate, a semiconductor chip and a heat dissipation structure. The semiconductor chip includes a first surface, a second surface opposite to the first surface, and at least one chip pad disposed adjacent to the first surface. The chip pad is electrically connected to the substrate. The heat dissipation structure is disposed adjacent to the second surface of the semiconductor chip and a portion of the substrate. An area of the heat dissipation structure is greater than an area of the semiconductor chip.

23 Claims, 14 Drawing Sheets

(51) Int. Cl.
*H01L 23/31* (2006.01)
*H01L 23/04* (2006.01)
*H01L 23/373* (2006.01)

(52) U.S. Cl.
CPC .............. *H01L 24/32* (2013.01); *H01L 24/73* (2013.01); *H01L 2224/131* (2013.01); *H01L 2224/13101* (2013.01); *H01L 2224/16225* (2013.01); *H01L 2224/16227* (2013.01); *H01L 2224/32225* (2013.01); *H01L 2224/48091* (2013.01); *H01L 2224/48106* (2013.01); *H01L 2224/48227* (2013.01); *H01L 2224/48228* (2013.01); *H01L 2224/49175* (2013.01); *H01L 2224/49431* (2013.01); *H01L 2224/49433* (2013.01); *H01L 2224/73204* (2013.01); *H01L 2224/73265* (2013.01); *H01L 2224/83493* (2013.01); *H01L 2224/8592* (2013.01); *H01L 2224/92125* (2013.01); *H01L 2924/00014* (2013.01); *H01L 2924/15321* (2013.01); *H01L 2924/16195* (2013.01); *H01L 2924/181* (2013.01)

(56) References Cited

U.S. PATENT DOCUMENTS

| 8,482,119 | B2 | 7/2013 | Lim et al. |
| 9,070,680 | B2 | 6/2015 | Kim |
| 9,653,376 | B1* | 5/2017 | Hsieh ................... H01L 23/3675 |
| 2010/0244236 | A1* | 9/2010 | Yun ..................... H01L 23/3128 |
| | | | 257/713 |
| 2012/0171814 | A1 | 7/2012 | Choi et al. |
| 2013/0016479 | A1* | 1/2013 | Hougham .............. B82Y 30/00 |
| | | | 361/719 |
| 2015/0179617 | A1* | 6/2015 | Lin ..................... H01L 25/0657 |
| | | | 257/713 |
| 2016/0073552 | A1* | 3/2016 | Hsu ......................... H01L 23/42 |
| | | | 361/704 |

OTHER PUBLICATIONS

Search Report for corresponding Chinese Patent Application No. 201710692396.4, dated Nov. 3, 2020, 6 pages (with English Translation).

* cited by examiner large amount of heat being generated and can raise a temperature of the semiconductor package. Due to the small size of the semiconductor package, it can be difficult to dissipate the heat. If the heat is not dissipated efficiently, the performance of the semiconductor package can be lowered, or the semiconductor package may break down or be rendered inoperative.

SEMICONDUCTOR PACKAGE

BACKGROUND

1. Field of the Disclosure

The present disclosure relates to a semiconductor package, and more particularly to a semiconductor package including a heat dissipation structure.

2. Description of the Related Art

A design of a semiconductor package includes high speed data transmission, high capacity and a small size. Heat dissipation is also an issue for such a semiconductor package. During operation, high speed data transmission can result in a significant amount of heat being generated and can raise a temperature of the semiconductor package. Due to the small size of the semiconductor package, it can be difficult to dissipate the heat. If the heat is not dissipated efficiently, the performance of the semiconductor package can be lowered, or the semiconductor package may break down or be rendered inoperative.

SUMMARY

In an aspect according to some embodiments, a semiconductor package includes a substrate, a semiconductor chip and a heat dissipation structure. The semiconductor chip includes a first surface, a second surface opposite to the first surface, and at least one chip pad disposed adjacent to the first surface. The chip pad is electrically connected to the substrate. The heat dissipation structure is disposed adjacent to the second surface of the semiconductor chip and a portion of the substrate. The heat dissipation structure has a first area and the semiconductor chip has a second area, and the ratio of the first area to the second area is greater than about 1.17.

In another aspect according to some embodiments, a semiconductor package includes a substrate, a semiconductor chip and a heat dissipation structure. The semiconductor chip includes a first surface, a second surface opposite to the first surface, at least one side surface extending between the first surface and the second surface, and at least one chip pad disposed adjacent to the first surface. The chip pad is electrically connected to the substrate. The heat dissipation structure covers the second surface and the side surface of the semiconductor chip and a portion of the substrate. An area of the heat dissipation structure is greater than an area of the semiconductor chip.

In another aspect according to some embodiments, a semiconductor package includes a substrate, a semiconductor chip and a heat dissipation structure. The semiconductor chip includes a first surface, a second surface opposite to the first surface, and at least one chip pad disposed adjacent to the first surface. The chip pad is electrically connected to the substrate. The heat dissipation structure is disposed between the second surface of the semiconductor chip and the substrate. An area of the heat dissipation structure is greater than an area of the semiconductor chip.

DETAILED DESCRIPTION

The present disclosure describes an improved semiconductor package and improved techniques for manufacturing the semiconductor package according to some embodiments. In some embodiments, the semiconductor package includes a heat dissipation structure. The semiconductor package and techniques of the present disclosure according to some embodiments are suitable, for example, for effectively dissipating heat generated by a semiconductor chip in the semiconductor package.

In general, heat dissipation is typically achieved by a metal plate or other heat sink (e.g., a stainless steel plate or an aluminum alloy plate) attached to a molding compound of a semiconductor package. The heat generated by the semiconductor chip in the semiconductor package is dissipated by the conductivity of the metal plate. The metal plate is conformal with the molding compound, thus, the efficiency of such heat dissipation is poor. To address these concerns, multi-fin type heat sinks can be used. Multi-fin type heat sinks are designed to have a plurality of surfaces to dissipate heat. However, the efficiency of heat dissipation of the fin type heat sink is still poor. In addition, it can be difficult to reduce a size of the fin type heat sink. In addition, another solution including multi-thermal vias can be used. However, new dissipation paths should be designed, and the dissipation paths including the thermal vias will occupy large areas of layout. In addition, other solutions including a high thermal compound can be used for the molding compound. However, the efficiency of such heat dissipation techniques is limited, and too many additives in the high thermal compound will result in poor protection for the semiconductor chip.

To address at least the above concerns, the present disclosure describes an improved semiconductor package according to some embodiments. The semiconductor package includes a heat dissipation structure disposed adjacent to a surface of the semiconductor chip and a portion of the substrate. The heat dissipation structure has a first area and the semiconductor chip has a second area, and the ratio of the first area to the second area may be greater than about 1.17. Thus, the heat dissipation area is increased. Furthermore, the heat dissipation structure can include a graphite layer with high thermal conductivity. Thus, highly efficient heat dissipation can be achieved. Additionally, the size of the semiconductor package can be reduced efficiently.

In a flip chip package according to some embodiments, a heat dissipation structure covers a backside surface and a side surface of a semiconductor chip and a portion of a substrate. In a wire bonding package according to some embodiments, a heat dissipation structure is disposed between a backside surface of a semiconductor chip and a substrate. Such configurations may significantly increase the heat dissipation area and may dissipate the heat generated by a semiconductor chip to the substrate quickly.

Figure 1:
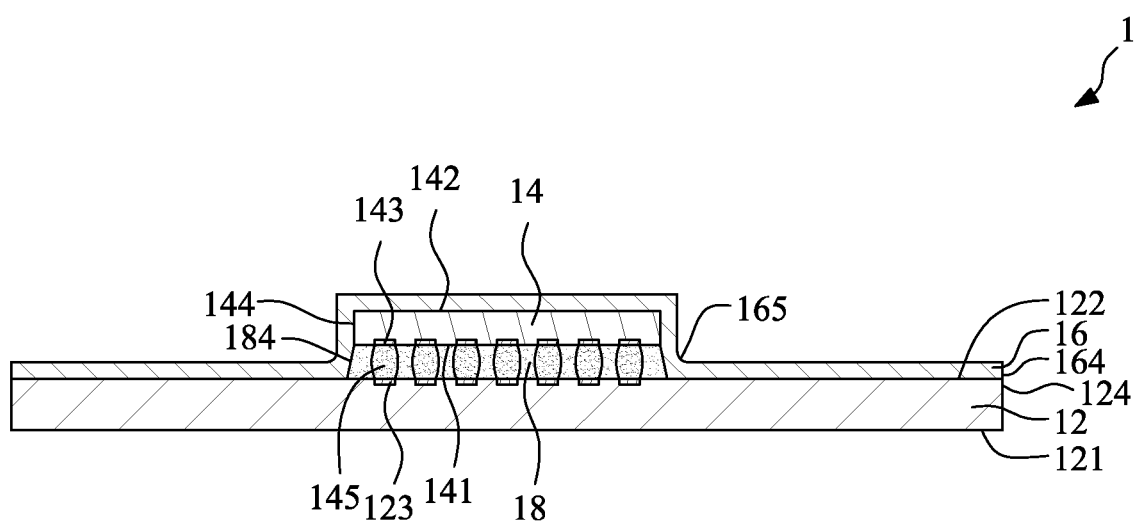
FIG. 1 illustrates an example of a cross-sectional view of a semiconductor package according to some embodiments of the present disclosure.

FIG. 1 illustrates an example of a cross-sectional view of a semiconductor package 1 according to some embodiments of the present disclosure. The semiconductor package 1 is an example of a flip chip package. The semiconductor package 1 includes a substrate 12, a semiconductor chip 14, a heat dissipation structure 16 and an underfill 18.

The substrate 12 may be an package substrate, and includes a first surface 121, a second surface 122 opposite to the first surface 121, at least one substrate pad 123 and at least one side surface 124 extending between the first surface 121 and the second surface 122. The material of the substrate 12 may be an organic material, silicon or glass. It is noted that the substrate 12 may be an interposer. A first patterned circuit layer may be disposed adjacent to the first surface 121, and a second patterned circuit layer including the substrate pad 123 may be disposed adjacent to the second surface 122 and electrically connected to the first patterned circuit layer. A plurality of external connectors may be disposed on the first surface 121 and electrically connected to the first patterned circuit layer.

The semiconductor chip 14 includes a first surface 141, a second surface 142 opposite to the first surface 141, at least one chip pad 143 disposed adjacent to the first surface 141, a side surface 144 extending between the first surface 141 and the second surface 142 and at least one conductive element 145 electrically connected to the chip pad 143. The first surface 141 is an active surface of the semiconductor chip 14 and faces the second surface 122 of the substrate 12. The second surface 142 is a backside surface of the semiconductor chip 14. The conductive element 145 (e.g., metal pillar, micro bump or solder ball) is attached to and electrically connected to the substrate pad 123 of the second patterned circuit layer on the second surface 122 of the substrate 12. Thus, the chip pad 143 of the semiconductor chip 14 is electrically connected to the substrate 12 through the conductive element 145 by flip chip bonding. That is, the semiconductor package 1 is a flip chip package. It is noted that a single semiconductor chip 14 is illustrated; however, the present disclosure is not limited to a single chip package. That is, the semiconductor package 1 may include a plurality of semiconductor chips 14.

The underfill 18 is disposed between the second surface 122 of the substrate 12 and the first surface 141 of the semiconductor chip 14 to surround and protect the conductive element 145.

The heat dissipation structure 16 is disposed adjacent to the second surface 142 of the semiconductor chip 14 and a portion of the substrate 12. As shown in FIG. 1, the heat dissipation structure 16 covers and contacts the second surface 142 and the four side surfaces 144 of the semiconductor chip 14, four side surfaces 184 of the underfill 18 and a portion of the second surface 122 of the substrate 12. Thus, a portion of the heat dissipation structure 16 is conformal with the semiconductor chip 14. In one or more embodiments, a side surface 164 of the heat dissipation structure 16 may be coplanar with the side surface 124 of the substrate 12. A corner line 165 of the heat dissipation structure 16 is between a portion of the heat dissipation structure 16 disposed on the second surface 122 of the substrate 12 and a portion of the heat dissipation structure 16 disposed on the side surface 144 of the semiconductor chip 14 and the side surface 184 of the underfill 18.

Figure 2:
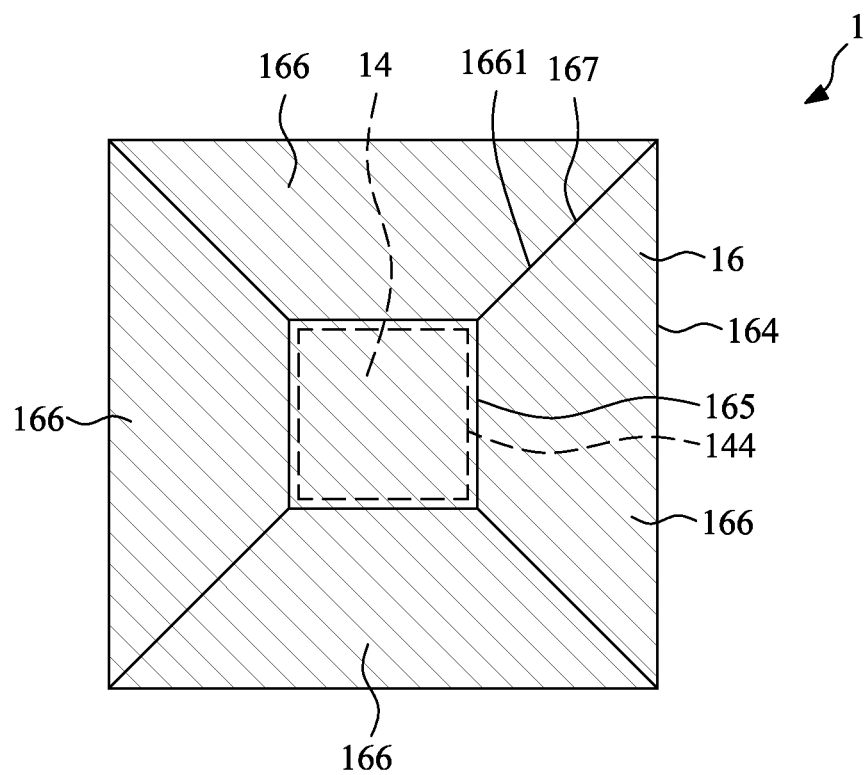
FIG. 2 illustrates a top view of the semiconductor package shown in FIG. 1 according to some embodiments of the present disclosure.

FIG. 2 illustrates a top view of the semiconductor package 1 shown in FIG. 1 according to some embodiments of the present disclosure. An area of the heat dissipation structure 16 is greater than an area of the semiconductor chip 14. In one or more embodiments, the entire heat dissipation structure 16 has a first area from a top view, and the entire semiconductor chip 14 has a second area from a top view. The ratio of the first area to the second area may be greater than about 1.17. In one or more embodiments, the ratio of the first area to the second area may be in a range of about 1.17 to about 7, for example, the ratio of the first area to the second area may be in a range of about 1.4 to about 6, or in a range of about 2 to about 5.

In addition, a portion of the heat dissipation structure 16 disposed on the second surface 122 of the substrate 12 includes four division portions 166 and four interfaces 167. The division portions 166 are separated from each other, and each of the division portions 166 corresponds to a respective side surface 144 of the semiconductor chip 14. Each of the division portions 166 has two inner side surfaces 1661. Thus, each of the division portions 166 is defined by the two inner side surfaces 1661, one side surface 164 and one corner line 165, and may be in a shape of trapezoid. As shown in FIG. 2, two inner side surfaces 1661 of two neighboring division portions 166 may contact each other to form an interface 167. Each of the interfaces 167 extends outward substantially from a corner of the semiconductor chip 14 to a corner of the heat dissipation structure 16 (or a corner of the substrate 12).

In some embodiments (e.g., as illustrated in FIGS. 1 and 2), the area of the heat dissipation structure 16 is greater than the area of the semiconductor chip 14, thus, a portion of the heat dissipation structure 16 extends to the second surface 122 of the substrate 12. Such configurations may significantly increase the heat dissipation area and may dissipate the heat generated by the semiconductor chip 14 to the substrate 12 quickly. Thus, highly efficient heat dissipation can be achieved. Additionally, the size of the semiconductor package 1 can be reduced efficiently.

Figure 3:
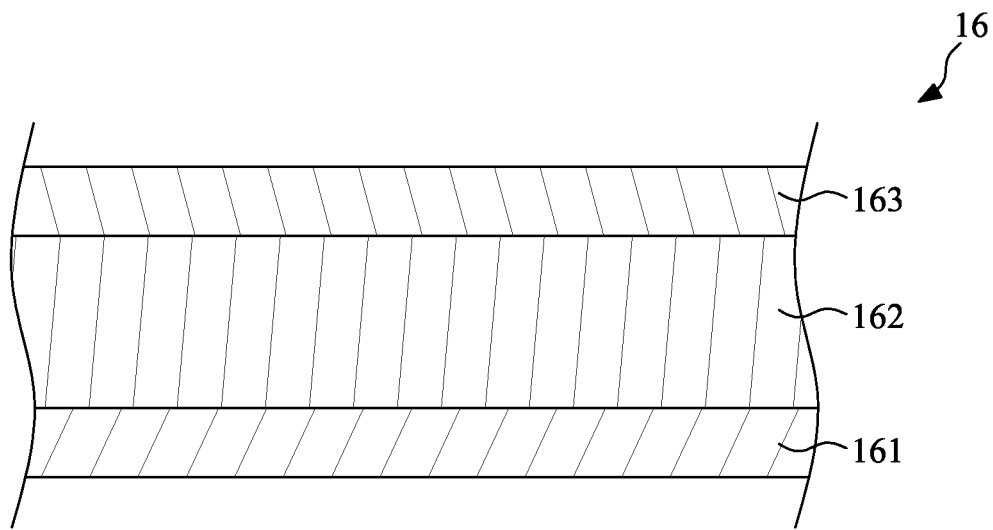
FIG. 3 illustrates an example of a cross-sectional view of the heat dissipation structure of the semiconductor package shown in FIG. 1 according to some embodiments of the present disclosure.

FIG. 3 illustrates an example of a cross-sectional view of the heat dissipation structure 16 of the semiconductor package 1 according to some embodiments of the present disclosure. The heat dissipation structure 16 may include an adhesion layer 161, a graphite layer 162 and a protection layer 163. The adhesion layer 161 is used to adhere the heat dissipation structure 16 to contact the second surface 142 and the side surface 144 of the semiconductor chip 14, the side surface 184 of the underfill 18 and a portion of the second surface 122 of the substrate 12. The material of the adhesion layer 161 may be an adhesive tape with low thermal resistance, and a thickness of the adhesion layer 161 may be about 10 micrometers (μm).

The graphite layer 162 is disposed between the protection layer 163 and the adhesion layer 161. The material of the graphite layer 162 may be pyrolytic graphite (e.g., formed by pyrolysis) as a heat spreader with thermal conductivity in a range of about 1400 watts per meter kelvin (W/mK) to about 2000 W/mK in a horizontal direction and in a range of about 5 W/mK to about 20 W/mK in a vertical direction. A thickness of the graphite layer 162 may be about 10 μm to about 40 μm. The protection layer 163 is disposed on the graphite layer 162 for protection and insulation. The material of the protection layer 163 may be polymer such as polyimide (PI), and a thickness of the protection layer 163 may be about 10 μm. Since the heat dissipation structure 16 can include the graphite layer 162 with high thermal conductivity, highly efficient heat dissipation can be achieved. In addition, the adhesion layer 161 is flexible, so that the graphite layer 162 can be attached to the second surface 142 and the side surfaces 144 of the semiconductor chip 14, the side surfaces 184 of the underfill 18 and a portion of the second surface 122 of the substrate 12 smoothly and evenly. Another carbonaceous material with a high thermal conductivity can be used in place of, or in combination with, graphite in the graphite layer 162.

Figure 4:
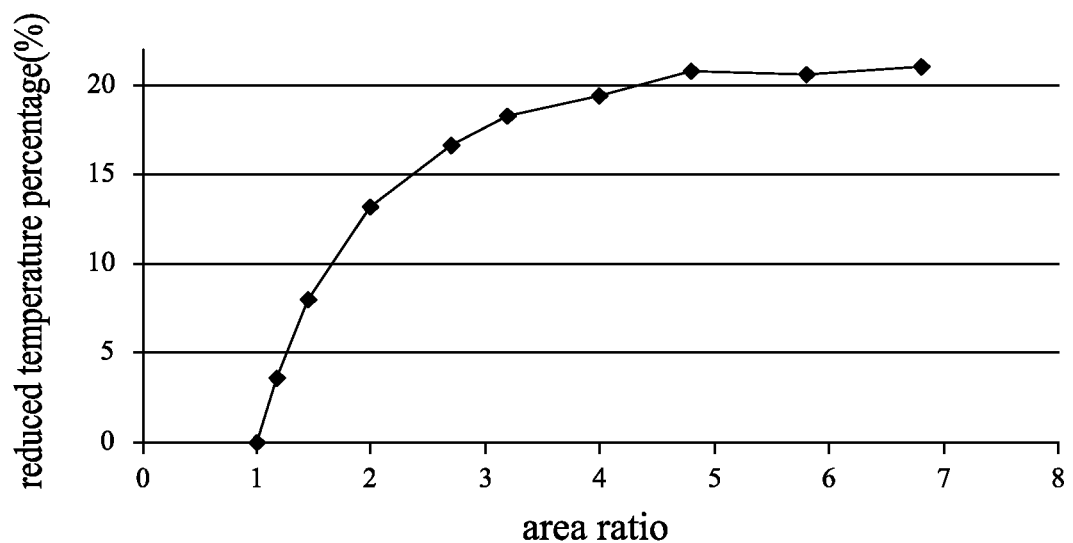
FIG. 4 illustrates a thermal performance evaluation of semiconductor packages according to some embodiments of the present disclosure.

FIG. 4 illustrates a thermal performance evaluation of semiconductor packages according to some embodiments of the present disclosure. In some embodiments, the conditions of a semiconductor package are: power is 3.5 watts (W); a size of the substrate 12 is 13 millimeters (mm) by 13 mm by 0.36 mm; and a size of the semiconductor chip 14 is 5.08 mm by 5.08 mm by 0.36 mm. The horizontal axis of FIG. 4 is an area ratio of the first area of the heat dissipation structure 16 from a top view to the second area of the semiconductor chip 14 from a top view. The vertical axis of FIG. 4 is the reduced temperature percentage (%) which is defined by $(T_r-T_0)/T_0$, wherein $T_0$ is the temperature of the second surface 142 of the semiconductor chip 14 without using any heat dissipation structure 16, and $T_r$ is the temperature of the second surface 142 of the semiconductor chip 14 when a heat dissipation structure 16 is covered over the semiconductor chip 14. As shown in FIG. 4, in some embodiments, when the area ratio is 1, the area of the heat dissipation structure 16 is equal to the area of the semiconductor chip 14 (e.g., the heat dissipation structure 16 just covers the semiconductor chip 14), and the reduced temperature percentage (%) is zero. For example, the heat dissipation structure 16 does not exhibit any heat dissipation effect.

Furthermore, in some embodiments, when the area ratio is 1.17, the area of the heat dissipation structure 16 is greater than the area of the semiconductor chip 14 (e.g., the heat dissipation structure 16 covers the semiconductor chip 14 and also extends to the second surface 122 of the substrate 12), the reduced temperature percentage (%) is about 3%. For example, the heat dissipation structure 16 exhibits a significant dissipation effect which results in a significant temperature difference (e.g., 3.19° Celsius (C)). Furthermore, in some embodiments, when the area ratio is in a range of about 1.4 to about 6, the heat dissipation structure 16 can cover the semiconductor chip 14 precisely, and the reduced temperature percentage (%) is in a range of about 8% to about 21%. However, as shown in FIG. 4, when the area ratio is greater than about 4 or about 5, a rate of increase of the reduced temperature percentage (%) is not so prominent, for example, the curve tends to be horizontal. Therefore, in some embodiments, the area ratio in a range of about 2 to about 5 may be adopted so that the heat dissipation structure 16 may be used efficiently.

Figure 5:
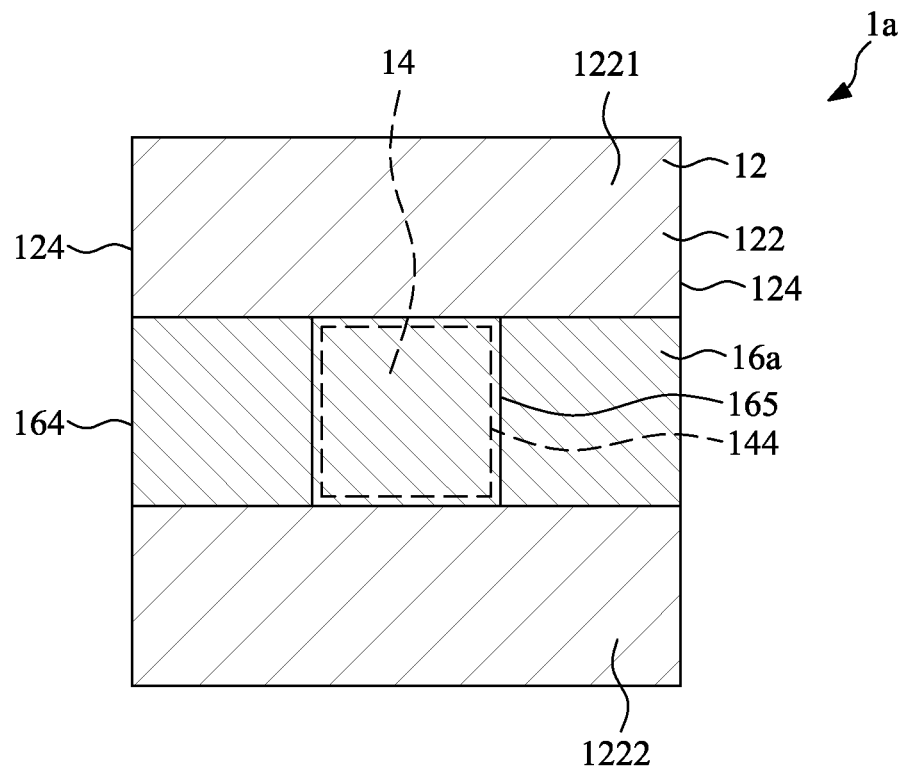
FIG. 5 illustrates an example of a top view of a semiconductor package according to some embodiments of the present disclosure.

FIG. 5 illustrates an example of a top view of a semiconductor package 1a according to some embodiments of the present disclosure. The semiconductor package 1a of FIG. 5 is similar to the semiconductor package 1 as shown in FIG. 2, except for the structure of the heat dissipation structure 16a. The heat dissipation structure 16a is a strip type, and a width of the heat dissipation structure 16a is substantially equal to a width of the semiconductor chip 14. Thus, the heat dissipation structure 16a covers and contacts the second surface 142 and the side surfaces 144 of the semiconductor chip 14, the side surfaces 184 of the underfill 18 and a portion of the second surface 122 of the substrate 12. As shown in FIG. 5, the heat dissipation structure 16a extends from a left side surface 124 of the substrate 12 to a right side surface 124 of the substrate 12, so that an upper portion 1221 and a lower portion 1222 (e.g., in an orientation shown in FIG. 5) of the second surface 122 of the substrate 12 is uncovered and exposed.

Figure 6:
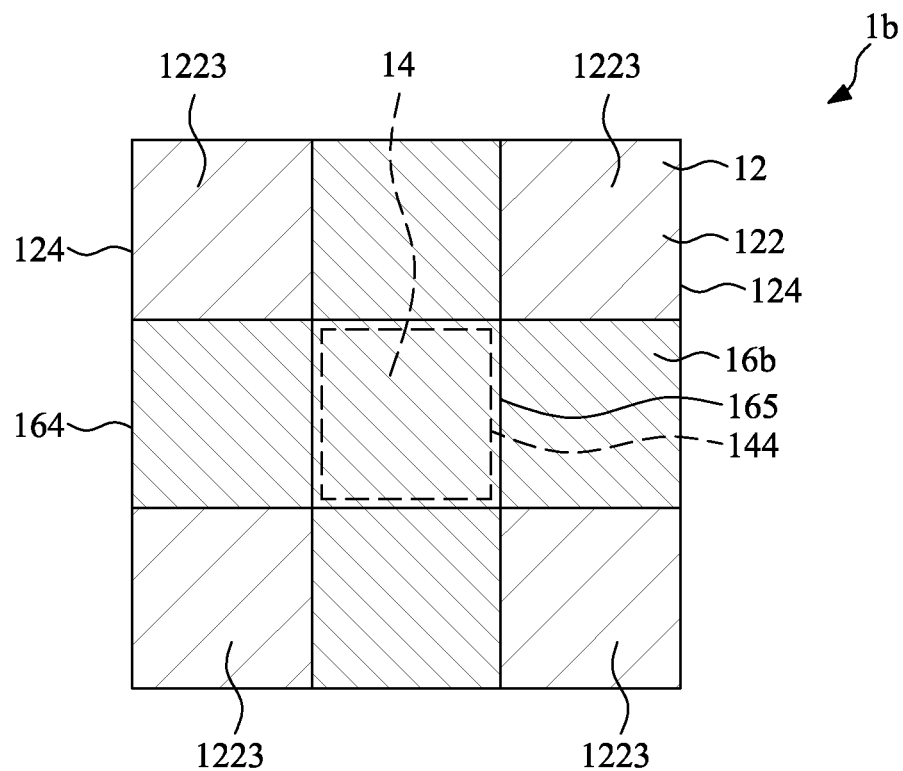
FIG. 6 illustrates an example of a top view of a semiconductor package according to some embodiments of the present disclosure.

FIG. 6 illustrates an example of a top view of a semiconductor package 1b according to some embodiments of the present disclosure. The semiconductor package 1b of FIG. 6 is similar to the semiconductor package 1a as shown in FIG. 5, except for the structure of the heat dissipation structure 16b. The heat dissipation structure 16b is a cross type and extends to the four side surfaces 124 of the substrate 12, so that four corner portion 1223 (e.g., in an orientation shown in FIG. 6) of the second surface 122 of the substrate 12 are uncovered and exposed.

Figure 7:
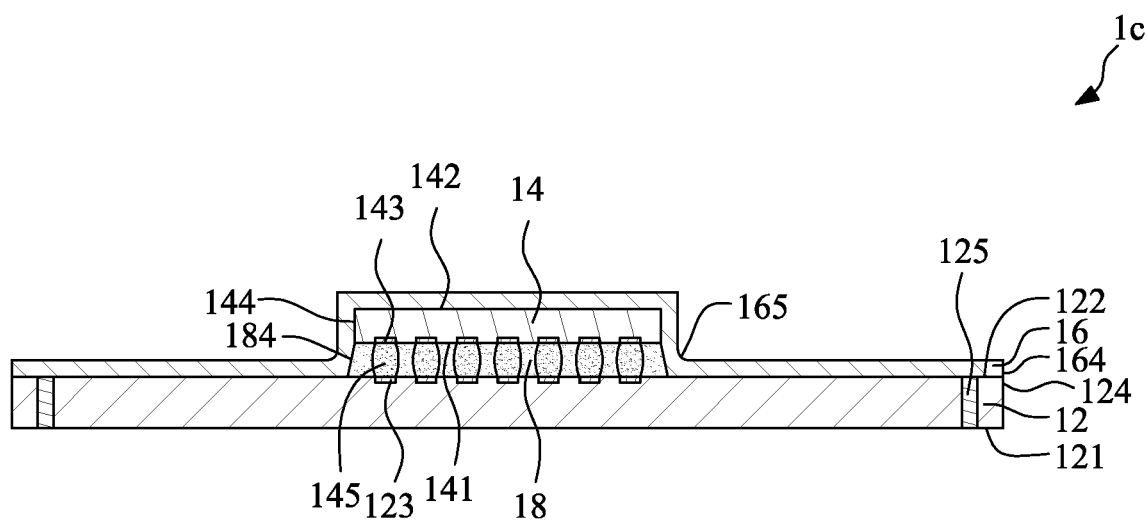
FIG. 7 illustrates an example of a cross-sectional view of a semiconductor package according to some embodiments of the present disclosure.

FIG. 7 illustrates an example of a cross-sectional view of a semiconductor package 1c according to some embodiments of the present disclosure. The semiconductor package 1c of FIG. 7 is similar to the semiconductor package 1 as shown in FIG. 1, except the substrate 12 further includes a plurality of thermal vias 125. The material of the thermal vias 125 may be conductive material such as metal. Each of the thermal vias 125 extends through the substrate 12 and contacts the heat dissipation structure 16 so as to dissipate the heat in the heat dissipation structure 16 to the first surface 121 of the substrate 12.

Figure 8:
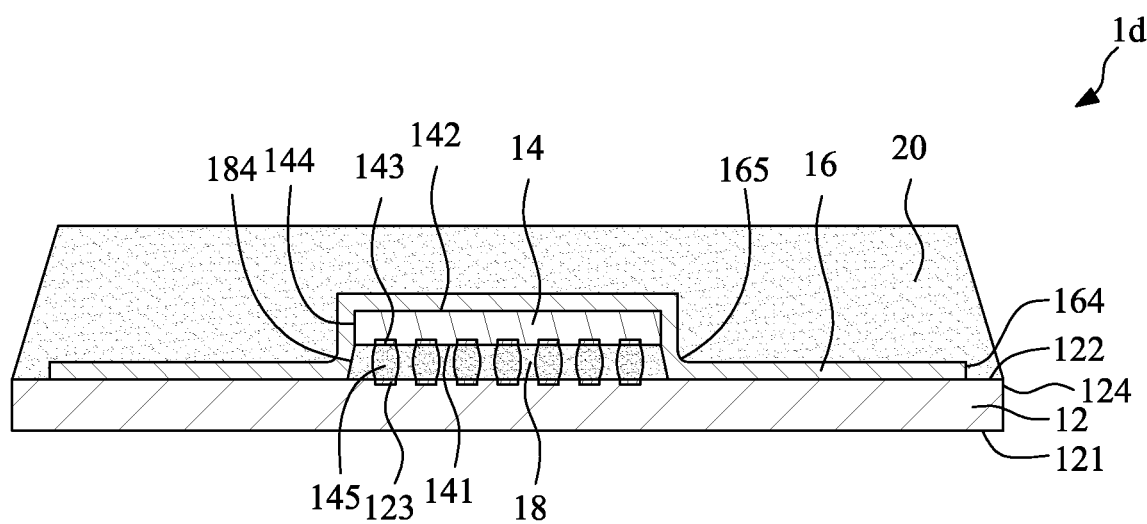
FIG. 8 illustrates an example of a cross-sectional view of a semiconductor package according to some embodiments of the present disclosure.

FIG. 8 illustrates an example of a cross-sectional view of a semiconductor package 1d according to some embodiments of the present disclosure. The semiconductor package 1d of FIG. 8 is similar to the semiconductor package 1 as shown in FIG. 1, except that an encapsulant 20 (e.g., molding compound) is further included. The encapsulant 20 contacts and covers the heat dissipation structure 16 so as to protect the semiconductor chip 14 and the heat dissipation structure 16. Furthermore, as shown in FIG. 8, the heat dissipation structure 16 does not cover the entire second surface 122 of the substrate 12, thus, the encapsulant 20 further covers a portion of the second surface 122 of the substrate 12. It is noted that in some embodiments (e.g., as illustrated in FIG. 8), the protection layer 163 of the heat dissipation structure 16 may be omitted, that is, the heat dissipation structure 16 may include the adhesion layer 161 and the graphite layer 162.

Figure 9:
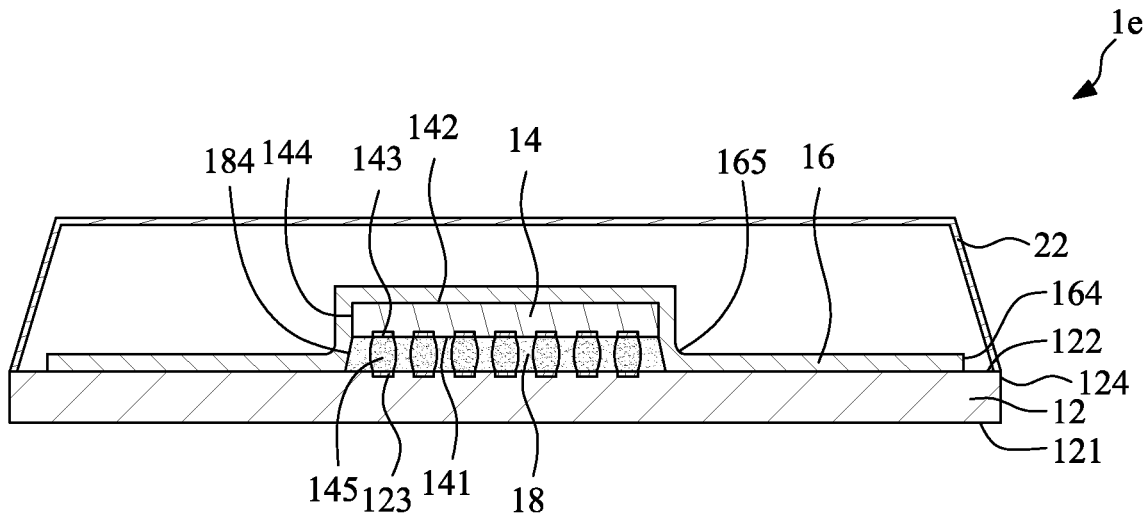
FIG. 9 illustrates an example of a cross-sectional view of a semiconductor package according to some embodiments of the present disclosure.

FIG. 9 illustrates an example of a cross-sectional view of a semiconductor package 1e according to some embodiments of the present disclosure. The semiconductor package 1e of FIG. 9 is similar to the semiconductor package 1 as shown in FIG. 1, except that a lid 22 is further included. The lid 22 covers the heat dissipation structure 16. For example, the semiconductor chip 14 and the heat dissipation structure 16 are accommodated in a space defined by the wall of the lid 22 so that the semiconductor chip 14 and the heat dissipation structure 16 are protected. Furthermore, as shown in FIG. 9, the heat dissipation structure 16 does not cover the entire second surface 122 of the substrate 12, thus, the bottom of the lid 22 may be attached to the second surface 122 of the substrate 12. It is noted that in some embodiments (e.g., as illustrated in FIG. 9), the protection layer 163 of the heat dissipation structure 16 may be omitted, that is, the heat dissipation structure 16 may include the adhesion layer 161 and the graphite layer 162.

Figure 10:
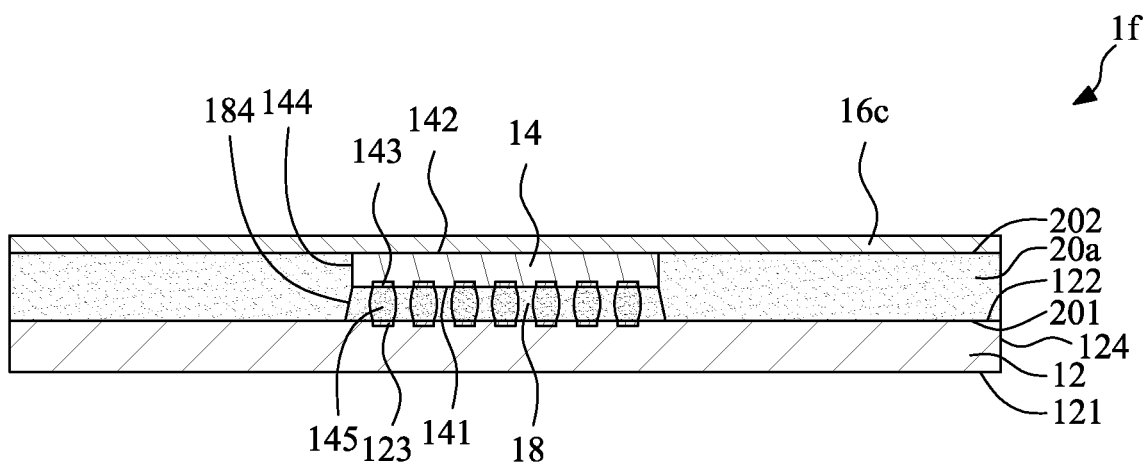
FIG. 10 illustrates an example of a cross-sectional view of a semiconductor package according to some embodiments of the present disclosure.

FIG. 10 illustrates an example of a cross-sectional view of a semiconductor package 1f according to some embodiments of the present disclosure. The semiconductor package 1f of FIG. 10 is similar to the semiconductor package 1d as shown in FIG. 8, except for the position of the heat dissipation structure 16. An encapsulant 20a covers and contacts the four side surfaces 144 of the semiconductor chip 14, four side surfaces 184 of the underfill 18 and a portion of the second surface 122 of the substrate 12. The encapsulant 20a includes a first surface 201 and a second surface 202. The first surface 201 of the encapsulant 20a contacts the second surface 122 of the substrate 12. The second surface 202 of the encapsulant 20a is coplanar with the second surface 142 of the semiconductor chip 14. For example, the second surface 142 of the semiconductor chip 14 is exposed from the encapsulant 20a. A heat dissipation structure 16c is a flat plate, and is disposed on and covers the second surface 202 of the encapsulant 20a and the second surface 142 of the semiconductor chip 14. It is noted that in some embodiments (e.g., as illustrated in FIG. 10), the adhesion layer 161 of the heat dissipation structure 16c may be omitted, that is, the heat dissipation structure 16c may include the protection layer 163 and the graphite layer 162. The graphite layer 162 may be attached to the second surface 202 of the encapsulant 20a directly.

Figure 11:
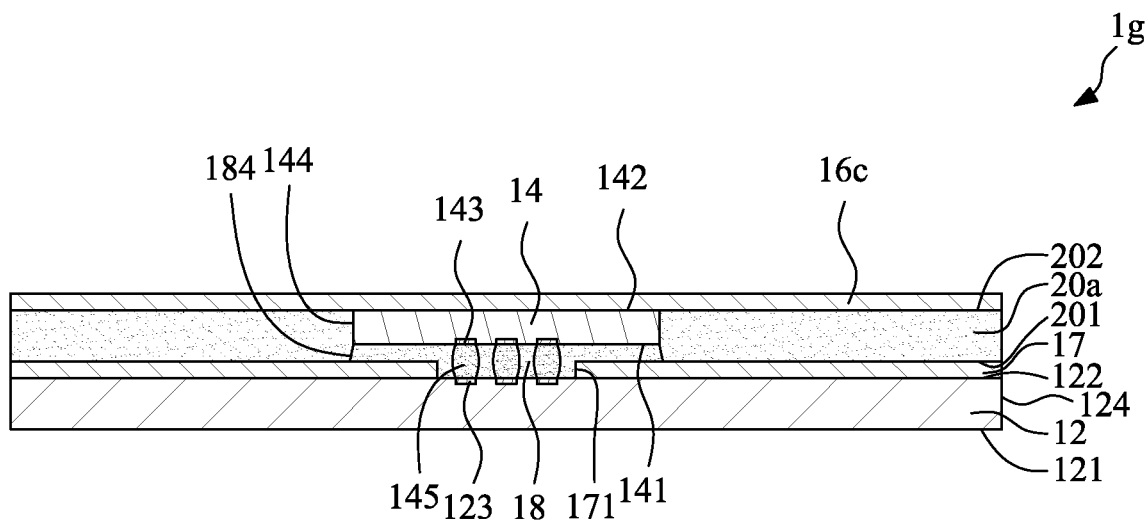
FIG. 11 illustrates an example of a cross-sectional view of a semiconductor package according to some embodiments of the present disclosure.

FIG. 11 illustrates an example of a cross-sectional view of a semiconductor package 1g according to some embodiments of the present disclosure. The semiconductor package 1g of FIG. 11 is similar to the semiconductor package 1f as shown in FIG. 10, except that an intermediate heat dissipation structure 17 is further included. The intermediate heat dissipation structure 17 is interposed between the first surface 201 of the encapsulant 20a and the second surface 122 of the substrate 12. The intermediate heat dissipation structure 17 defines at least one opening 171 under or aligned with the semiconductor chip 14, and a size of the opening 171 is less than a size of the semiconductor chip 14 from a top view. The chip pad 143 of the semiconductor chip 14 and the substrate pad 123 of the substrate 12 are disposed at the positions corresponding to or aligned with the opening 171 of the intermediate heat dissipation structure 17 so that the conductive element 145 can be disposed in the opening 171 of the intermediate heat dissipation structure 17. It is noted that in some embodiments (e.g., as illustrated in FIG. 11), the intermediate heat dissipation structure 17 is similar to the heat dissipation structure 16c, and both are used for heat dissipation. However, the intermediate heat dissipation structure 17 may include an adhesion layer and a graphite layer. For example, a protection layer may be omitted.

Figure 12:
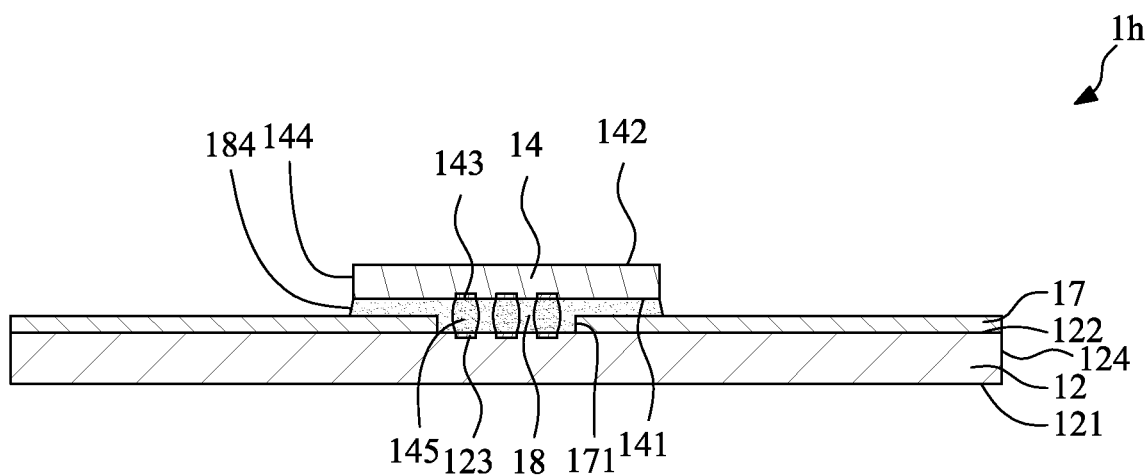
FIG. 12 illustrates an example of a cross-sectional view of a semiconductor package according to some embodiments of the present disclosure.

FIG. 12 illustrates an example of a cross-sectional view of a semiconductor package 1h according to some embodiments of the present disclosure. The semiconductor package 1h of FIG. 12 is similar to the semiconductor package 1g as shown in FIG. 11, except that the heat dissipation structure 16c and the encapsulant 20a are omitted. It is noted that in some embodiments (e.g., as illustrated in FIG. 12), the intermediate heat dissipation structure 17 may include three layers (e.g., an adhesion layer, a graphite layer and a protection layer).

Figure 13:
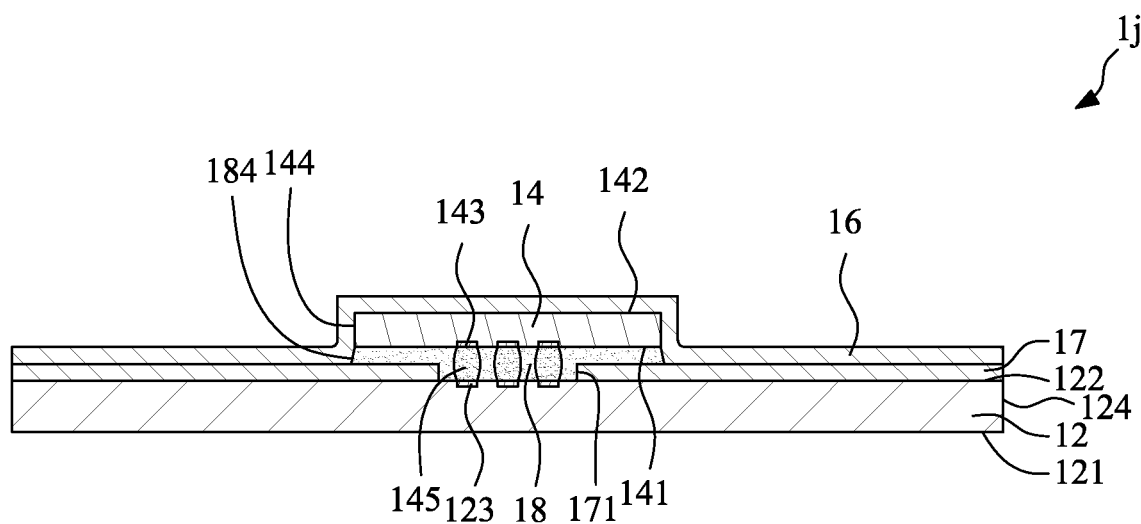
FIG. 13 illustrates an example of a cross-sectional view of a semiconductor package according to some embodiments of the present disclosure.

FIG. 13 illustrates an example of a cross-sectional view of a semiconductor package 1j according to some embodiments of the present disclosure. The semiconductor package 1j of FIG. 13 is similar to the semiconductor package 1 as shown in FIG. 1, except that an intermediate heat dissipation structure 17 is further included. The intermediate heat dissipation structure 17 is interposed between the heat dissipation structure 16 and the second surface 122 of the substrate 12. For example, the heat dissipation structure 16 covers and contacts the intermediate heat dissipation structure 17. The intermediate heat dissipation structure 17 defines at least one opening 171 under or aligned with the semiconductor chip 14, and a size of the opening 171 is less than a size of the semiconductor chip 14 from a top view. The chip pad 143 of the semiconductor chip 14 and the substrate pad 123 of the substrate 12 are disposed at the positions corresponding to or aligned with the opening 171 of the intermediate heat dissipation structure 17 so that the conductive element 145 can be disposed in the opening 171 of the intermediate heat dissipation structure 17. It is noted that in some embodiments (e.g., as illustrated in FIG. 13), the intermediate heat dissipation structure 17 is similar to the heat dissipation structure 16, and both are used for heat dissipation. However, the intermediate heat dissipation structure 17 may include an adhesion layer and a graphite layer. For example, a protection layer may be omitted.

Figure 14:
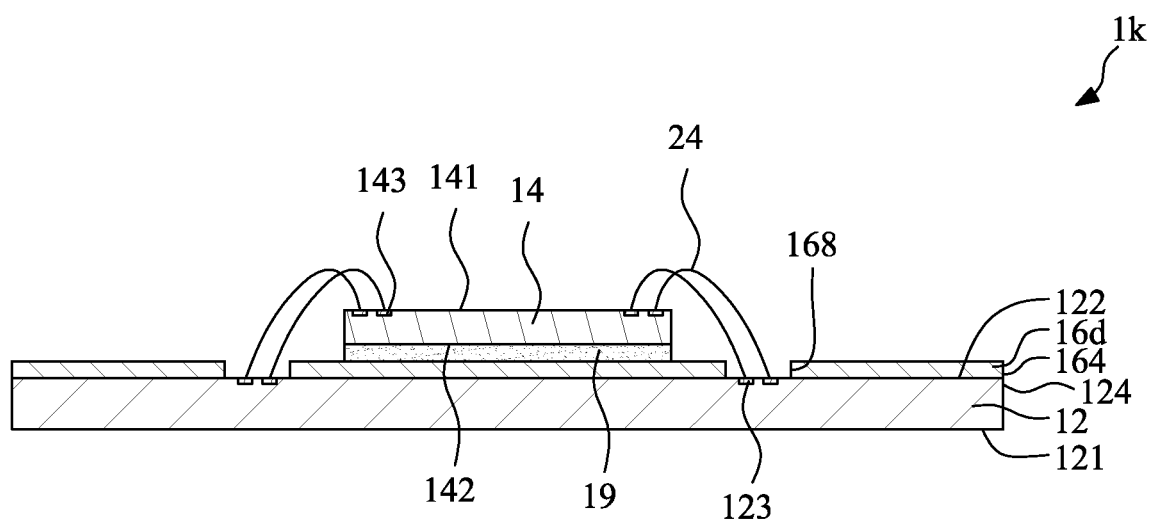
FIG. 14 illustrates an example of a cross-sectional view of a semiconductor package according to some embodiments of the present disclosure.

FIG. 14 illustrates an example of a cross-sectional view of a semiconductor package 1k according to some embodiments of the present disclosure. The semiconductor package 1k is an example of a wire-bonding package. The semiconductor package 1k includes the substrate 12, the semiconductor chip 14, the heat dissipation structure 16d and at least one bonding wire 24.

The substrate 12 of FIG. 14 is similar to the substrate 12 of FIG. 1 except for the position of the substrate pad 123. The semiconductor chip 14 of FIG. 14 is similar to the semiconductor chip 14 of FIG. 1 except for the position of the chip pad 143, and the conductive element 145 is omitted. The first surface 141 is an active surface of the semiconductor chip 14. The second surface 142 is a backside surface of the semiconductor chip 14 and faces the second surface 122 of the substrate 12. The bonding wire 24 electrically connects the chip pad 143 of the semiconductor chip 14 and the substrate pad 123 of the substrate 12. Thus, the chip pad 143 of the semiconductor chip 14 is electrically connected to the substrate 12 through the bonding wire 24.

The heat dissipation structure 16d is disposed between the second surface 142 of the semiconductor chip 14 and the second surface 122 of the substrate 12. The heat dissipation structure 16d is similar to the heat dissipation structure 16 and may include the adhesion layer 161, the graphite layer 162 and the protection layer 163 (e.g., as shown in FIG. 3), in which the graphite layer 162 is disposed between the protection layer 163 and the adhesion layer 161, and the adhesion layer 161 contacts the substrate 12. However, in some embodiments, the heat dissipation structure 16d may include the adhesion layer 161 and the graphite layer 162. As shown in FIG. 14, the second surface 142 of the semiconductor chip 14 is adhered to the heat dissipation structure 16d through an adhesion layer 19. Furthermore, the heat dissipation structure 16d defines at least one opening 168 to expose a portion (e.g., the substrate pad 123) of the substrate 12, and the bonding wire 24 passes through the opening 168 of the heat dissipation structure 16d.

Figure 15:
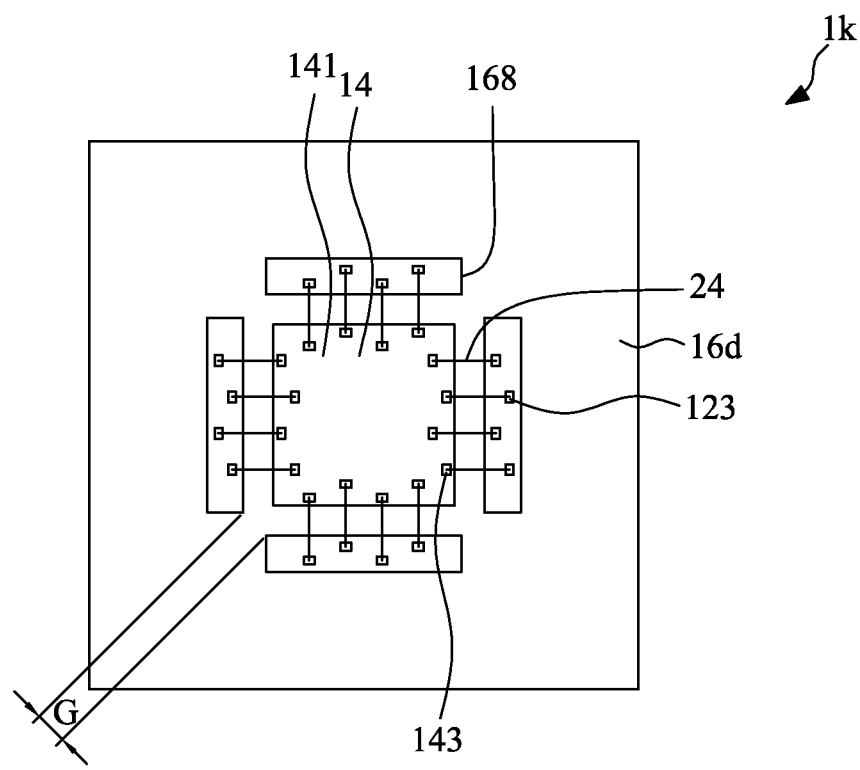
FIG. 15 illustrates a top view of the semiconductor package shown in FIG. 14 according to some embodiments of the present disclosure.

FIG. 15 illustrates a top view of the semiconductor package 1k shown in FIG. 14 according to some embodiments of the present disclosure. An area of the heat dissipation structure 16d is greater than an area of the semiconductor chip 14. The heat dissipation structure 16d defines at least two openings 168, and a gap G between two neighboring openings 168 is greater than about 1 mm, about 2 mm or about 3 mm. In addition, each of the openings 168 may expose at least two rows of the substrate pads 123 of the substrate 12.

Figure 16:
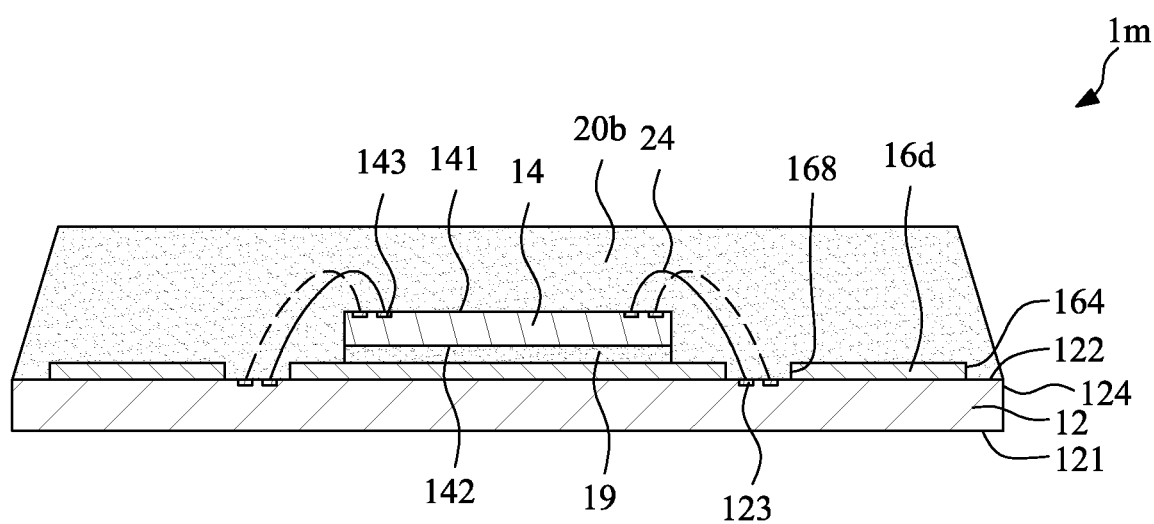
FIG. 16 illustrates an example of a cross-sectional view of a semiconductor package according to some embodiments of the present disclosure.

FIG. 16 illustrates an example of a cross-sectional view of a semiconductor package 1m according to some embodiments of the present disclosure. The semiconductor package 1m of FIG. 16 is similar to the semiconductor package 1k as shown in FIG. 14, except that an encapsulant 20b (e.g., molding compound) is further included. The encapsulant 20b contacts and covers the semiconductor chip 14, the bonding wire 24 and the heat dissipation structure 16d so as to protect the semiconductor chip 14, the bonding wire 24 and the heat dissipation structure 16d. Furthermore, as shown in FIG. 16, the heat dissipation structure 16d does not cover the entire second surface 122 of the substrate 12, thus, the encapsulant 20b further covers a portion of the second surface 122 of the substrate 12. It is noted that in some embodiments (e.g., as illustrated in FIG. 16), the protection layer of the heat dissipation structure 16d may be omitted, that is, the heat dissipation structure 16d may include the adhesion layer and the graphite layer.

Figure 17:
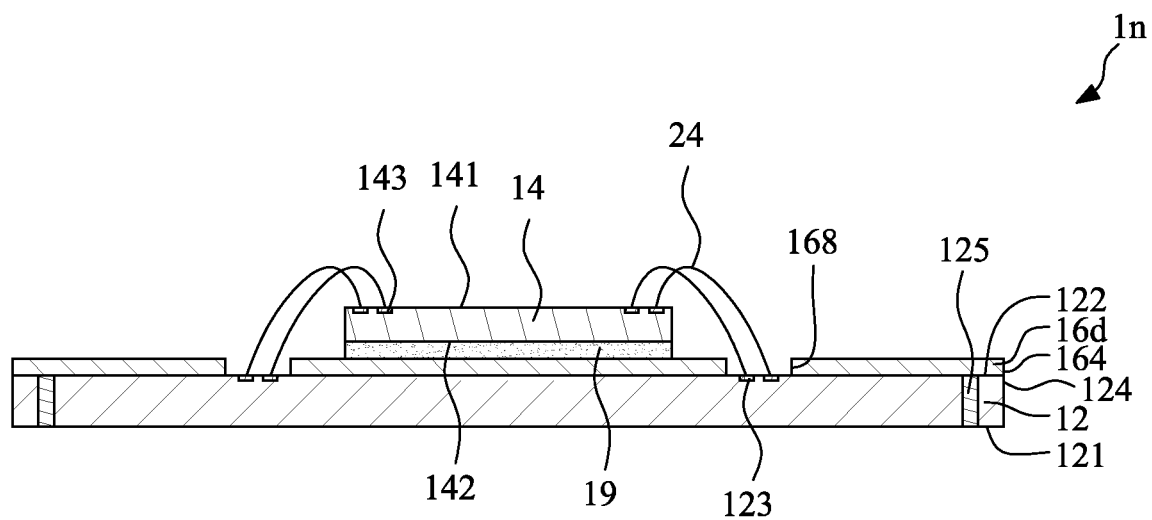
FIG. 17 illustrates an example of a cross-sectional view of a semiconductor package according to some embodiments of the present disclosure.

FIG. 17 illustrates an example of a cross-sectional view of a semiconductor package 1n according to some embodiments of the present disclosure. The semiconductor package 1n of FIG. 17 is similar to the semiconductor package 1k as shown in FIG. 14, except that the substrate 12 further includes a plurality of thermal vias 125. The material of the thermal vias 125 may be conductive material such as metal. Each of the thermal vias 125 extends through the substrate 12 and contacts the heat dissipation structure 16d so as to dissipate the heat in the heat dissipation structure 16d to the first surface 121 of the substrate 12.

Figure 18:
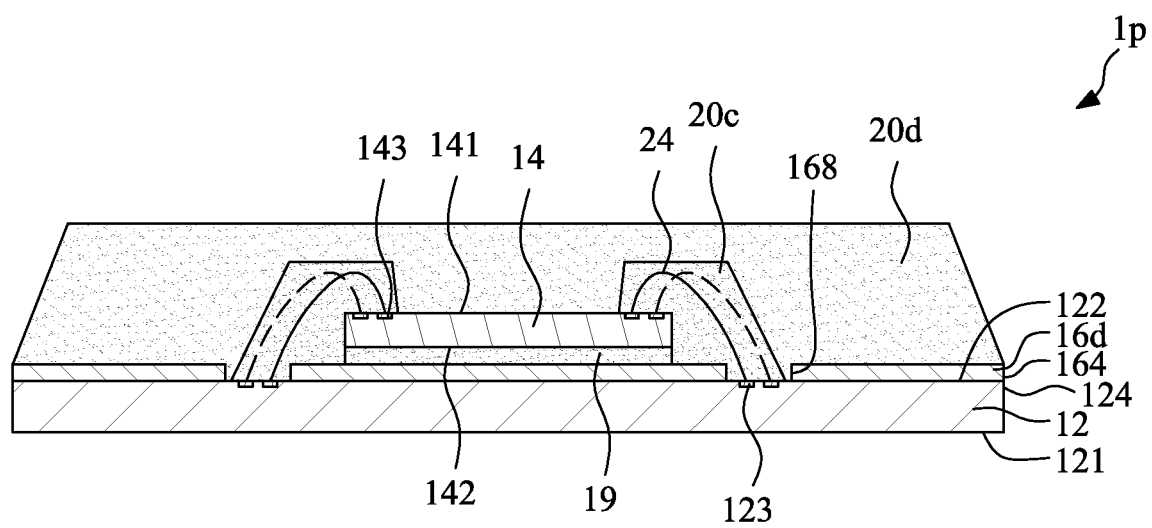
FIG. 18 illustrates an example of a cross-sectional view of a semiconductor package according to some embodiments of the present disclosure.

FIG. 18 illustrates an example of a cross-sectional view of a semiconductor package 1p according to some embodiments of the present disclosure. The semiconductor package 1p of FIG. 18 is similar to the semiconductor package 1k as shown in FIG. 14, except that a first encapsulant 20c and a second encapsulant 20d are further included. The first encapsulant 20c covers and contacts the bonding wire 24, a portion of the heat dissipation structure 16d under the bonding wire 24 and a portion of the semiconductor chip 14 under the bonding wire 24 for insulation. The first encapsulant 20c may be a molding compound with a thermal conductivity of about 0.9 W/mK, and may be formed by transfer molding or dispensing. The second encapsulant 20d covers and contacts the first encapsulant 20c, the semiconductor chip 14 and the heat dissipation structure 16d for heat dissipation. The second encapsulant 20d may be a molding compound with a thermal conductivity of about 10.0 W/mK, and may be formed by transfer molding. For example, the thermal conductivity of the second encapsulant 20d may be about 5 or about 10 times the thermal conductivity of the first encapsulant 20c.

Figure 19:
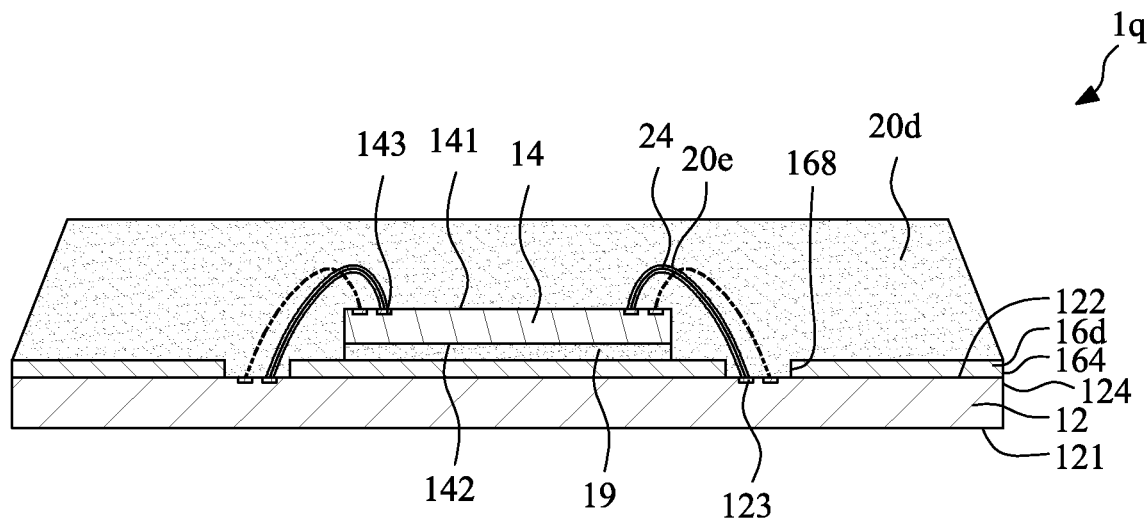
FIG. 19 illustrates an example of a cross-sectional view of a semiconductor package according to some embodiments of the present disclosure.

FIG. 19 illustrates an example of a cross-sectional view of a semiconductor package 1q according to some embodiments of the present disclosure. The semiconductor package 1q of FIG. 19 is similar to the semiconductor package 1p as shown in FIG. 18, except that a first encapsulant 20e covers and contacts the bonding wire 24. For example, the first encapsulant 20e does not contact the heat dissipation structure 16d and the semiconductor chip 14. The first encapsulant 20e may be a molding compound with a thermal conductivity of about 0.9 W/mK, and may be formed by jetting or steep. The thickness of the first encapsulant 20e on the bonding wire 24 may be substantially consistent or even. The second encapsulant 20d covers and contacts the first encapsulant 20e, the semiconductor chip 14 and the heat dissipation structure 16d for heat dissipation. The thermal conductivity of the second encapsulant 20d may be about 5 or about 10 times the thermal conductivity of the first encapsulant 20e.

Figure 20:
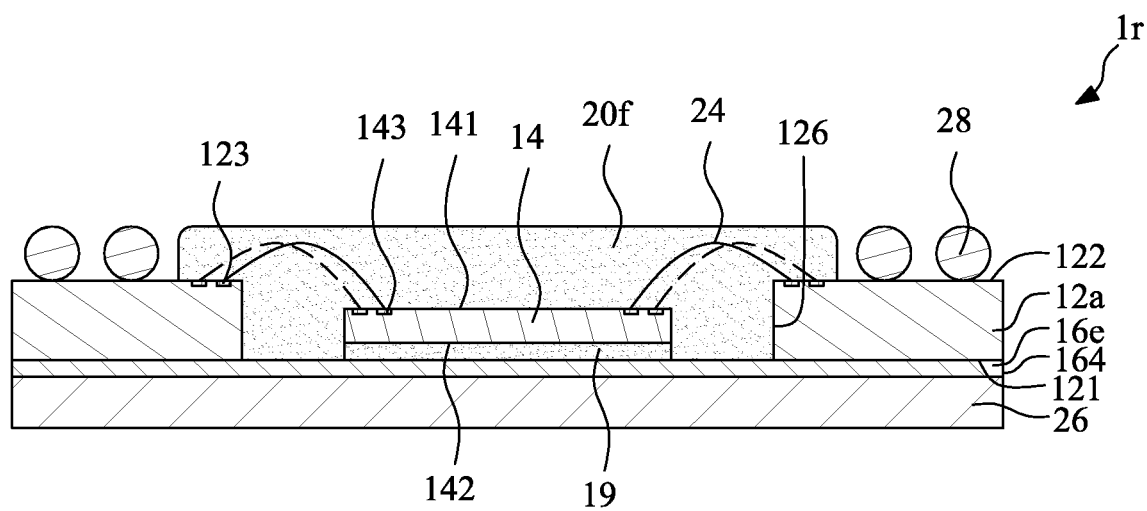
FIG. 20 illustrates an example of a cross-sectional view of a semiconductor package according to some embodiments of the present disclosure.

FIG. 20 illustrates an example of a cross-sectional view of a semiconductor package 1r according to some embodiments of the present disclosure. The semiconductor package 1r is an example of a cavity down ball grid array (BGA) package. The semiconductor package 1r includes a substrate 12a, the semiconductor chip 14, a heat dissipation structure 16e, at least one bonding wire 24, an encapsulant 20f and a carrier 26.

The substrate 12a of FIG. 20 is similar to the substrate 12 of FIG. 14 except that the substrate 12a further defines a through hole 126 extending through the substrate 12a, and the substrate pad 123 may be disposed around the through hole 126. The heat dissipation structure 16e is disposed on the first surface 121 of the substrate 12a. The heat dissipation structure 16e is a flat plate and may include an adhesion layer and a graphite layer, in which the graphite layer is disposed on the adhesion layer.

The carrier 26 (e.g., glass) is attached to the adhesion layer of the heat dissipation structure 16e. The semiconductor chip 14 of FIG. 20 is similar to the semiconductor chip 14 of FIG. 14. The semiconductor chip 14 is disposed in a cavity defined by the through hole 126 of the substrate 12a and the heat dissipation structure 16e. The first surface 141 is an active surface of the semiconductor chip 14. The second surface 142 is a backside surface of the semiconductor chip 14 and is adhered to the heat dissipation structure 16e (e.g., the graphite layer of the heat dissipation structure 16e). The bonding wire 24 electrically connects the chip pad 143 of the semiconductor chip 14 and the substrate pad 123 of the substrate 12a. Thus, the chip pad 143 of the semiconductor chip 14 is electrically connected to the substrate 12a through the bonding wire 24.

The encapsulant 20f (e.g., molding compound) fills the cavity defined by the through hole 126 of the substrate 12a and the heat dissipation structure 16e, and extends to the second surface 122 of the substrate 12a. As shown in FIG. 20, the encapsulant 20f contacts and covers the semiconductor chip 14, the bonding wire 24 and a portion of the heat dissipation structure 16e so as to protect the semiconductor chip 14, the bonding wire 24 and the heat dissipation structure 16e. In addition, a plurality of external connectors 28 may be disposed on the second surface 122 of the substrate 12a for external connection.

Figure 21:
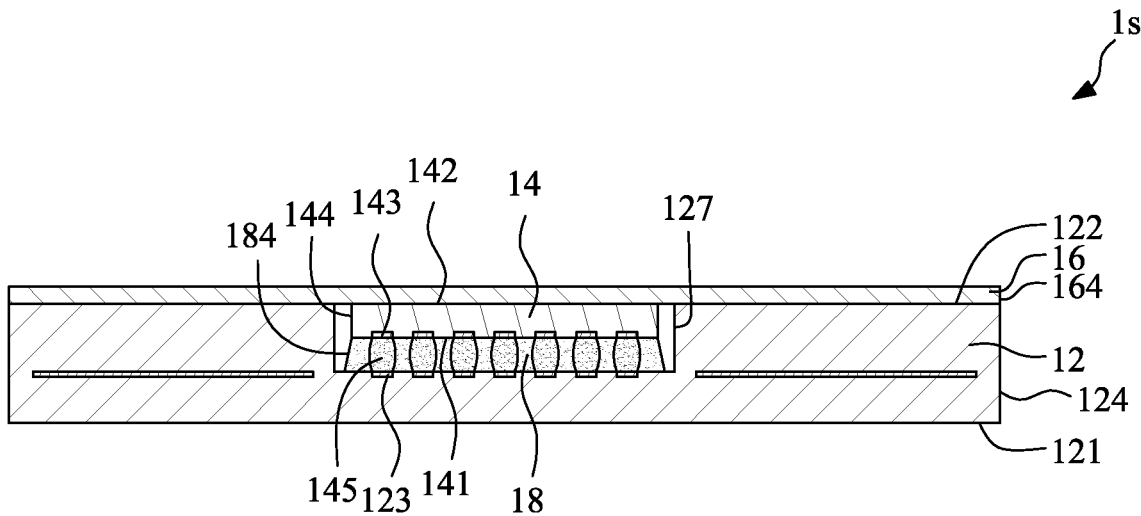
FIG. 21 illustrates an example of a cross-sectional view of a semiconductor package according to some embodiments of the present disclosure.

FIG. 21 illustrates an example of a cross-sectional view of a semiconductor package 1s according to some embodiments of the present disclosure. The semiconductor package 1s of FIG. 21 is similar to the semiconductor package 1 as shown in FIG. 1, except the substrate 12 further includes a cavity 127. The substrate pads 123 are exposed in the cavity 127, and the semiconductor chip 14 is disposed in the cavity 127. The chip pad 143 of the semiconductor chip 14 is electrically connected to the substrate 12 through the conductive element 145 by flip chip bonding. The underfill 18 is disposed between the bottom surface of the cavity 127 and the first surface 141 of the semiconductor chip 14 to surround and protect the conductive element 145. The second surface 142 of the semiconductor chip 14 is substantially coplanar with the second surface 122 of the substrate 12. The heat dissipation structure 16 covers and contacts the second surface 142 of the semiconductor chip 14 and the second surface 122 of the substrate 12.

Figure 22:
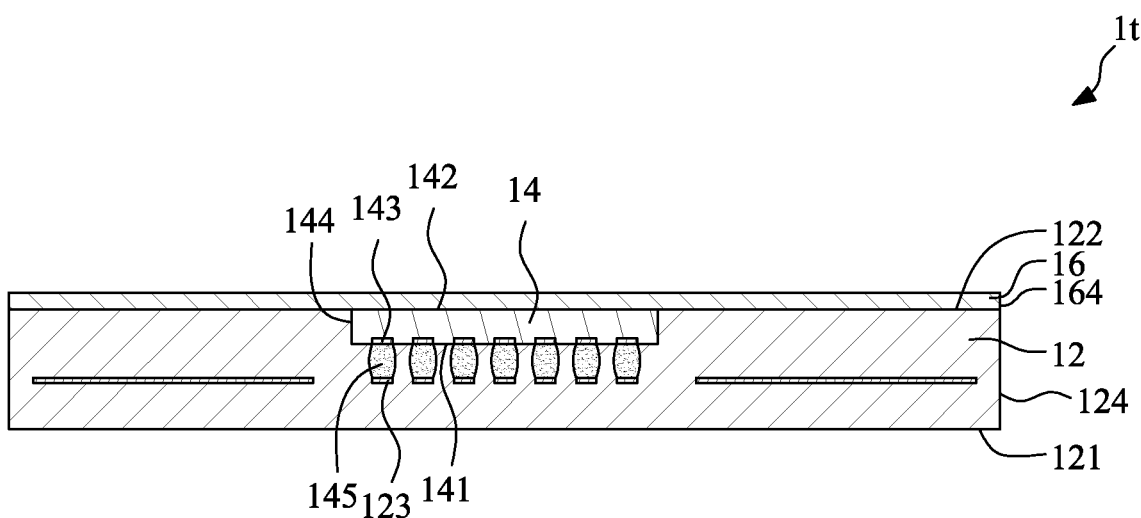
FIG. 22 illustrates an example of a cross-sectional view of a semiconductor package according to some embodiments of the present disclosure.

FIG. 22 illustrates an example of a cross-sectional view of a semiconductor package 1t according to some embodiments of the present disclosure. The semiconductor package 1t of FIG. 22 is similar to the semiconductor package is as shown in FIG. 21, except the substrate 12 does not include the cavity 127, and the semiconductor chip 14 and the conductive element 145 are embedded in the substrate 12

Figure 23:
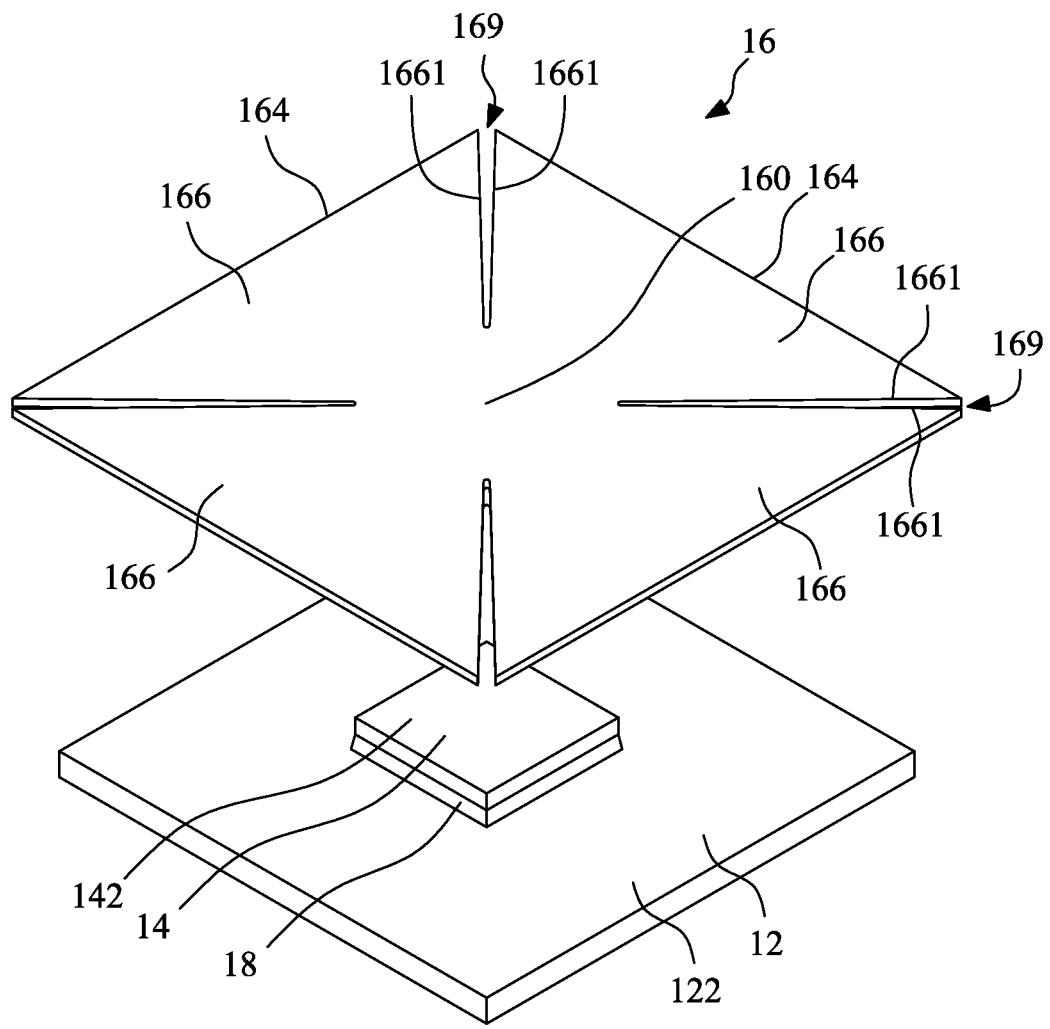
FIG. 23 illustrates a semiconductor manufacturing process according to some embodiments of the present disclosure.

FIG. 23 illustrates a semiconductor manufacturing process according to some embodiments of the present disclosure. In some embodiments, the semiconductor manufacturing process is used to manufacture a semiconductor package such as the semiconductor package 1 as shown in FIGS. 1 and 2. Referring to FIG. 23, the substrate 12, the semiconductor chip 14 and the heat dissipation structure 16 are provided. The substrate 12 may be a package substrate, and includes the first surface 121, the second surface 122 opposite to the first surface 121, at least one substrate pad 123 and at least one side surface 124 extending between the first surface 121 and the second surface 122 as shown in FIG. 1. The material of the substrate 12 may be an organic material, silicon or glass. It is noted that the substrate 12 may be an interposer.

The semiconductor chip 14 includes the first surface 141, the second surface 142 opposite to the first surface 141, at least one chip pad 143 disposed adjacent to the first surface 141, the side surface 144 extending between the first surface 141 and the second surface 142 and at least one conductive element 145 electrically connected to the chip pad 143 as shown in FIG. 1. The first surface 141 is an active surface of the semiconductor chip 14, and faces the second surface 122 of the substrate 12. The second surface 142 is a backside surface of the semiconductor chip 14. The conductive element 145 (e.g., metal pillar, micro bump or solder ball) is attached to and electrically connected to the substrate pad 123 of the substrate 12. Thus, the semiconductor chip 14 is electrically connected to the substrate 12 through the conductive element 145 by flip chip bonding. The underfill 18 may be disposed between the second surface 122 of the substrate 12 and the first surface 141 of the semiconductor chip 14 to surround and protect the conductive element 145.

The heat dissipation structure 16 is a flat plate, includes a main portion 160, four division portions 166, and defines four notches 169. An area of the heat dissipation structure 16 is greater than an area of the semiconductor chip 14. The main portion 160 corresponds to or aligns with the second surface 142 of the semiconductor chip 14. The division portions 166 are separated from each other, and connect to the main portion 160. Each of the division portions 166 has two inner side surfaces 1661. Thus, each of the division portions 166 is defined by the two inner side surfaces 1661, the main portion 160 and one side surface 164, and may be in a shape of a trapezoid. As shown in FIG. 23, two inner side surfaces 1661 of two neighboring division portions 166 may define the notch 169. Each of the notches 169 extends outward substantially from a corner of the main portion 160 to a corner of the heat dissipation structure 16.

Then, the heat dissipation structure 16 is attached to the second surface 142 of the semiconductor chip 14 and a portion of the substrate 12 so as to obtain the semiconductor package 1 as shown in FIGS. 1 and 2. The heat dissipation structure 16 covers and contacts the second surface 142 and the four side surfaces 144 of the semiconductor chip 14, four side surfaces 184 of the underfill 18 and a portion of the second surface 122 of the substrate 12. Thus, a portion of the heat dissipation structure 16 is conformal with the semiconductor chip 14. In one or more embodiments, the flexibility of the heat dissipation structure 16 and the design of the notches 169 can facilitate the attachment process of the heat dissipation structure 16. Thus, the heat dissipation structure 16 can be attached to the second surface 142 and the side surfaces 144 of the semiconductor chip 14, the side surfaces 184 of the underfill 18 and a portion of the second surface 122 of the substrate 12 smoothly and evenly. After the attachment, as shown in FIG. 2, two inner side surfaces 1661 of two neighboring division portions 166 may contact each other to form an interface 167. Thus, the notches 169 may disappear.

Figure 24:
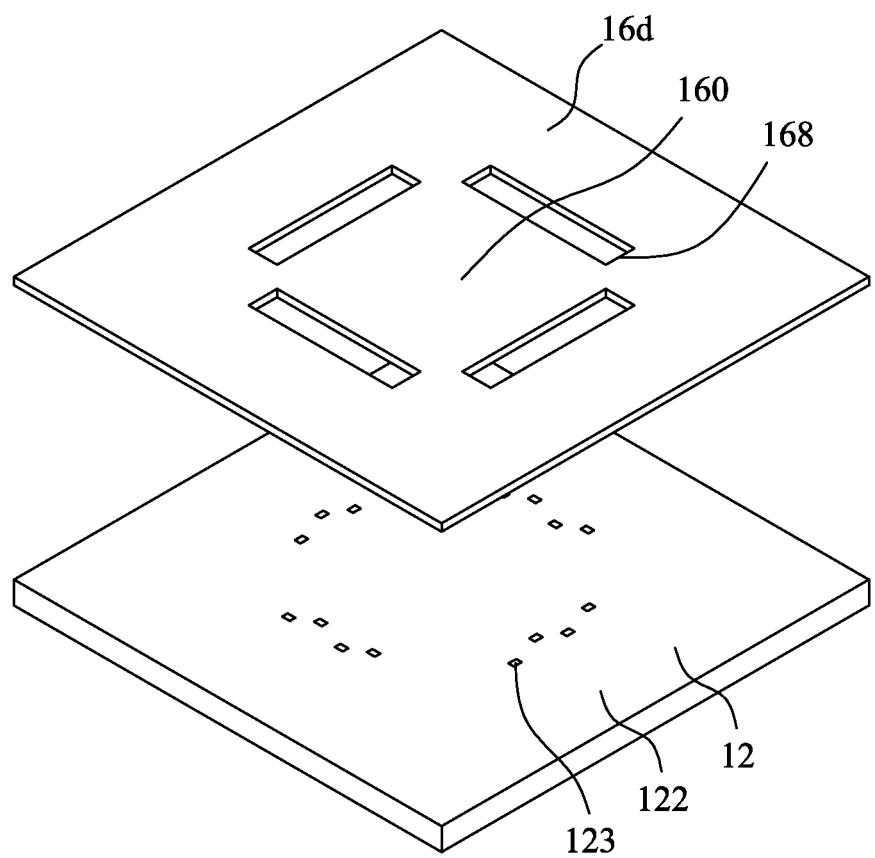
FIG. 24 and FIG. 25 illustrate a semiconductor manufacturing process according to some embodiments of the present disclosure.
Figure 25:
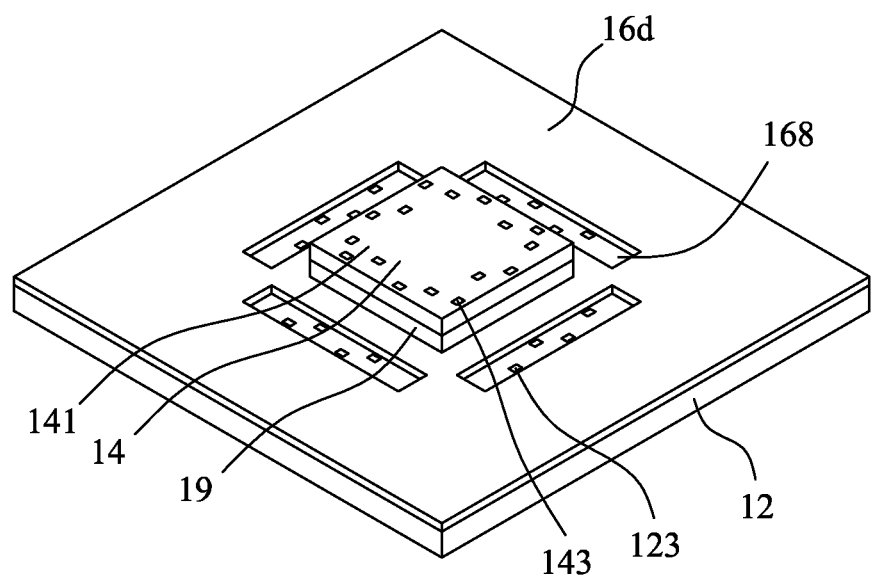

FIGS. 24 and 25 illustrate a semiconductor manufacturing process according to some embodiments of the present disclosure. In some embodiments, the semiconductor manufacturing process is used to manufacture a semiconductor package such as the semiconductor package 1k as shown in FIGS. 14 and 15. Referring to FIG. 24, the substrate 12 and the heat dissipation structure 16d are provided. The substrate 12 may be a package substrate, and includes the first surface 121, the second surface 122 opposite to the first surface 121, at least one substrate pad 123 and at least one side surface 124 extending between the first surface 121 and the second surface 122 as shown in FIG. 14. The heat dissipation structure 16d is a flat plate, includes a main portion 160, and defines four openings 168. The main portion 160 corresponds to or aligns with the second surface 142 of the semiconductor chip 14. The openings 168 surround the main portion 160, and are not in communication with each other.

Referring to FIG. 25, the heat dissipation structure 16d is attached to the second surface 122 of the substrate 12. A portion (e.g., the substrate pad 123) of the substrate 12 is exposed from the openings 168. Then, a second surface 142 of a semiconductor chip 14 as shown in FIG. 14 is attached to the main portion 160 of the heat dissipation structure 16d. Then, at least one bonding wire 24 electrically connects the chip pad 143 of the semiconductor chip 14 and the substrate pad 123 of the substrate 12. Thus, the chip pad 143 of the semiconductor chip 14 is electrically connected to the substrate 12 through the bonding wire 24, and the bonding wire 24 passes through the opening 168 of the heat dissipation structure 16d. Therefore, the semiconductor package 1k as shown in FIGS. 14 and 15 is obtained.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

As used herein, the singular terms "a," "an," and "the" may include plural referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For another example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 μm, or within 1 μm of lying along the same plane.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package, comprising:
a substrate having a surface;
a semiconductor chip including a first surface, a second surface opposite to the first surface, at least one side surface extending between the first surface and the second surface, a plurality of corners, and at least one chip pad disposed adjacent to the first surface, wherein the chip pad is electrically connected to the substrate; and
a heat dissipation structure having a uniform thickness and covering the second surface and the side surface of the semiconductor chip and a portion of the substrate,
wherein a first portion of the heat dissipation structure disposed on the substrate includes four interfaces and four division portions, the four interfaces respectively extend outward from the plurality of corners of the semiconductor chip,
the four division portions are separated from each other by the four interfaces, and
the four division portions cover and contact the surface of the substrate,
wherein a width of each of the four division portions is greater than a width of the semiconductor chip,
wherein all of the four division portions are lower than the chip pad of the semiconductor chip.

2. The semiconductor package of claim 1, wherein the heat dissipation structure includes a graphite layer.

3. The semiconductor package of claim 2, wherein the heat dissipation structure further includes a protection layer and an adhesion layer, the graphite layer is disposed between the protection layer and the adhesion layer, and the adhesion layer contacts the second surface and the side surface of the semiconductor chip and the portion of the substrate.

4. The semiconductor package of claim 1, wherein the width of each of the four division portions is equal to a shortest distance between a corner line of the heat dissipation structure and a side surface of the heat dissipation structure.

5. The semiconductor package of claim 1, wherein a distance from a side surface of the heat dissipation structure to a side surface of the substrate is less than a distance from the side surface of the heat dissipation structure to a corner line of the heat dissipation structure.

6. The semiconductor package of claim 1, further comprising a conductive element, wherein the chip pad is electrically connected to the substrate via the conductive element, and a thickness of each of the four division portions is within a thickness range of the conductive element.

7. The semiconductor package of claim 1, wherein a side surface of the heat dissipation structure is coplanar with a side surface of the substrate.

8. The semiconductor package of claim 1, wherein each of the four division portions is in a shape of a trapezoid.

9. The semiconductor package of claim 1, wherein each of the four division portions tapers along a direction from a side surface of the substrate towards a corner line of the heat dissipation structure.

10. The semiconductor package of claim 1, further comprising a conductive element, wherein the chip pad is electrically connected to the substrate via the conductive element, and a corner line of the heat dissipation structure surrounds the conductive element.

11. The semiconductor package of claim 1, wherein the four division portions do not expose the surface of the substrate.

12. The semiconductor package of claim 1, wherein the substrate has a plurality of corners, and the four interfaces respectively extend to respective corners of the plurality of corners of the substrate.

13. The semiconductor package of claim 1, wherein the heat dissipation structure has a first area and the semiconductor chip has a second area, and a ratio of the first area to the second area is in a range of about 1.17 to about 7.

14. The semiconductor package of claim 1, further comprising a conductive element, wherein the chip pad is electrically connected to the substrate via the conductive element, and the conductive element is higher than the four division portions.

15. The semiconductor package of claim 1, wherein an area of each of the four division portions is greater than an area of the semiconductor chip.

16. A semiconductor package, comprising:
a substrate having a surface;
a semiconductor chip including a first surface, a second surface opposite to the first surface, at least one side surface extending between the first surface and the second surface, a plurality of corners, and at least one chip pad disposed adjacent to the first surface, wherein the chip pad is electrically connected to the substrate; and
a heat dissipation structure covering the second surface and the side surface of the semiconductor chip and a portion of the substrate,
wherein a first portion of the heat dissipation structure disposed on the substrate includes four interfaces and four division portions, the four interfaces respectively extend outward from the plurality of corners of the semiconductor chip, the four division portions are separated from each other by the four interfaces, and the four division portions cover and contact the surface of the substrate,
wherein the side surface of the semiconductor chip is higher than the four division portions.

17. The semiconductor package of claim 1, wherein each of the four division portions includes two inner side surfaces, and each of the interfaces is defined by an inner side surface of a respective one of the division portions and an inner side surface of a respective division portion neighboring the one of the division portions.

18. The semiconductor package of claim 1, further comprising an intermediate heat dissipation structure disposed between the semiconductor chip and the substrate, wherein the substrate has at least one substrate pad disposed adjacent to the surface, and the intermediate heat dissipation structure defines at least one opening to expose the substrate pad of the substrate.

19. The semiconductor package of claim 18, wherein the heat dissipation structure contacts the intermediate heat dissipation structure.

20. The semiconductor package of claim 18, wherein a size of the opening is less than a size of the semiconductor chip from a top view.

21. The semiconductor package of claim 18, further comprising at least one bonding wire electrically connecting the chip pad of the semiconductor chip and the substrate pad of the substrate, wherein the bonding wire passes through the opening.

22. The semiconductor package of claim 1, wherein each of the four division portions is defined by two inner side surfaces.

23. The semiconductor package of claim 22, wherein two inner side surfaces of two neighboring division portions contact each other.

* * * * *